(12) United States Patent
Chien (10) Patent No.: US 8,363,773 B2
(45) Date of Patent: Jan. 29, 2013

(54) DIGITAL PHASE INTERPOLATION CONTROL FOR CLOCK AND DATA RECOVERY CIRCUIT

(75) Inventor: Jinn-Yeh Chien, Chu Bei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1054 days.

(21) Appl. No.: 12/254,753

(22) Filed: Oct. 20, 2008

(65) Prior Publication Data

US 2010/0098203 A1 Apr. 22, 2010

(51) Int. Cl.
*H04L 7/00* (2006.01)
(52) U.S. Cl. ........ 375/371; 375/354; 375/374; 375/375; 713/400
(58) Field of Classification Search .......... 375/371, 375/354, 374, 375; 713/400
See application file for complete search history.

(56) References Cited

U.S. PATENT DOCUMENTS

| 5,850,422 | A | * | 12/1998 | Chen | 375/371 |
| 6,100,736 | A | * | 8/2000 | Wu et al. | 327/159 |
| 6,275,555 | B1 | * | 8/2001 | Song | 375/375 |
| 2002/0094786 | A1 | * | 7/2002 | Berliner et al. | 455/67.4 |
| 2007/0063687 | A1 | * | 3/2007 | Zhou et al. | 323/315 |

FOREIGN PATENT DOCUMENTS

JP 2006-050607 2/2006

OTHER PUBLICATIONS

Fukaishi, Muneo et al., "A 29Gb/s CMOS Multi-Channel Transmitter and Receiver Chip Set for Ultra-High Resolution Digital Display", 2000 IEEE Int'l Solid-State Circuits Conference, 2000.
Kromer, Chriatian, et al. "A 25-Gb/s CDR in 90-nm CMOS for High-Density Interconnects", IEEE Journal of Solid-State Circuits, vol. 41, No. 12, Dec. 2006, pp. 2921-2929.
JP Office Action Appln. No. 2009-146582 dated Jan. 17, 2012.

* cited by examiner

*Primary Examiner* — Sam K Ahn
*Assistant Examiner* — Leila Malek
(74) *Attorney, Agent, or Firm* — K&L Gates LLP (57) ABSTRACT

This invention discloses a phase interpolation controller for a clock and data recovery circuit receiving an indication of a phase relationship between a first and a second signal, the phase interpolation controller comprises a plurality of serially coupled bi-directional shift-registers, wherein when the received indication indicates the first signal is ahead of the second signal in phase, the plurality of serially coupled bi-directional shift-registers shifts in one of the bi-directions, and when the received indication indicates the first signal is behind the second signal in phase, the plurality of serially coupled bi-directional shift-registers shifts in the other of the bi-directions.

11 Claims, 6 Drawing Sheets

DIGITAL PHASE INTERPOLATION CONTROL FOR CLOCK AND DATA RECOVERY CIRCUIT

BACKGROUND

The present invention relates generally to integrated circuit (IC) design, and, more particularly, to the design of a phase interpolation control for clock and data recovery circuits.

As semiconductor process technology progresses, IC chips can operate at greater speed and offer greater processing power. This places a greater demand for inter chip data communications. High speed serial link communication is one of the most important interface technologies in computers, high-speed routers/switches as well as consumer electronics. During a high speed serial transmission, a data signal is transmitted from a transmission chip. The data signal may be polluted on the transmission line. At a receiving chip, a clock and data recovery (CDR) circuit is provided to recover the transmitted signal. Phase interpolation is often employed in constructing the CDR circuit, which occupies less chip area and consumes less power as compared with phase-locked-loop (PLL) based CDR circuits.

Figure 1:
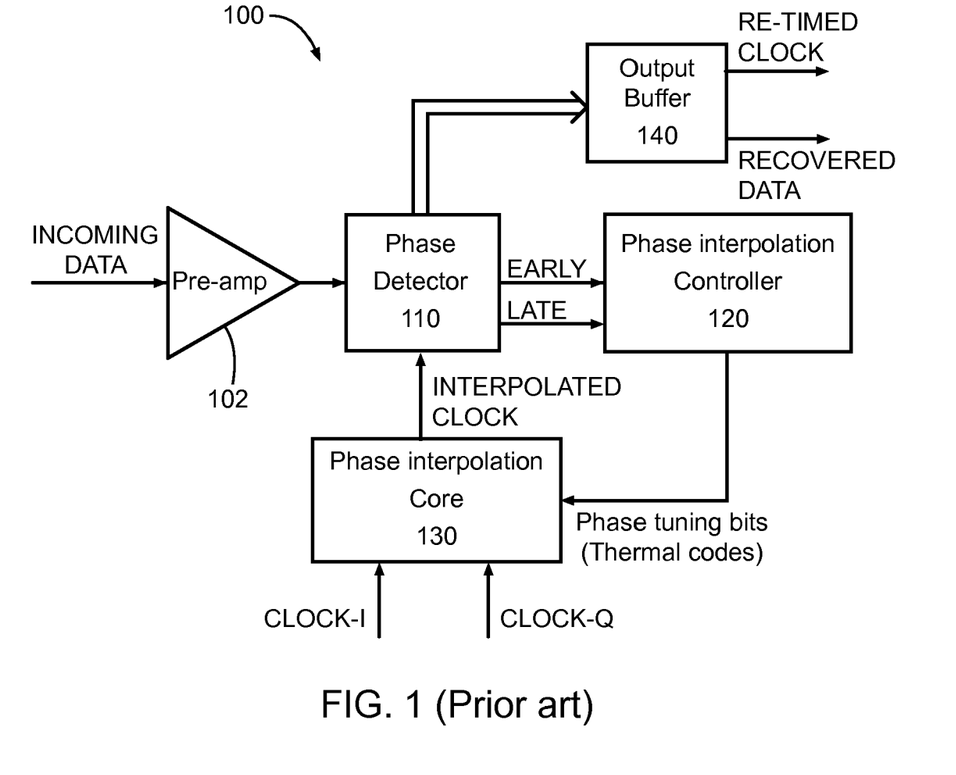
FIG. 1 is a block diagram illustrating a conventional phase interpolation based CDR circuit 100.

FIG. 1 is a block diagram illustrating a phase interpolation based CDR circuit 100 in a receiving chip. The CDR circuit 100 comprises a pre-amplifier 102, a phase detector 110, a phase interpolation controller 120, a phase interpolation core 130 and an output buffer 140. Incoming data is first amplified by the pre-amplifier 102, and then fed into the phase detector 110 which compares the incoming data with an internally generated clock signal, i.e., INTERPOLATED CLOCK, and produces an EARLY or LATE signal as well as a RE-TIMED CLOCK and a RECOVERED DATA signal through the output buffer 140. The phase interpolation controller 120 responds to the EARLY or LATE signal to generate phase tuning bits to control the phase interpolation by the phase interpolation core 130. The phase tuning bits are typically thermal codes. The phase interpolation core 130 uses the thermal codes to modify the phase of the INTERPOLATED CLOCK signal until the phase of the INTERPOLATED CLOCK aligns with that of the INCOMING DATA. When the INCOMING DATA is ahead of the INTERPOLATED CLOCK, an EARLY pulse will be generated. The EARLY pulse causes the phase of the INTERPOLATED CLOCK to shift ahead and become more in-phase with the INCOMING DATA. On the other hand, if the INCOMING DATA is behind the INTERPOLATED CLOCK, a LATE pulse will be generated. The LATE pulse causes the phase of the INTERPOLATED CLOCK to shift backward and become more in-phase with the INCOMING DATA.

Figure 2:
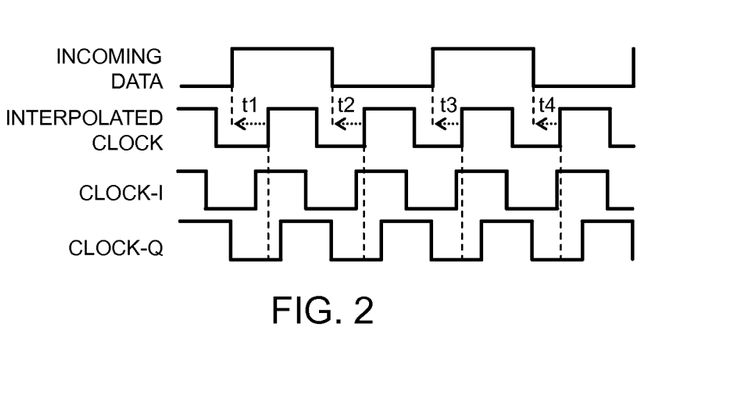
FIG. 2 is a timing diagram illustrating the process of aligning the INTERPOLATED CLOCK signal with the INCOMING DATA signal.

FIG. 2 is a timing diagram illustrating the process of aligning the INTERPOLATED CLOCK signal with the INCOMING DATA signal. The INCOMING DATA and the INTERPOLATED CLOCK have phase differences t1, t2, t3 and t4 at different clock cycles. After each clock cycle, the phase difference becomes smaller, i.e., t1>t2>t3>t4, as a result of the phase interpolation controlled by the phase interpolation controller 120 of FIG. 1.

Figure 3:
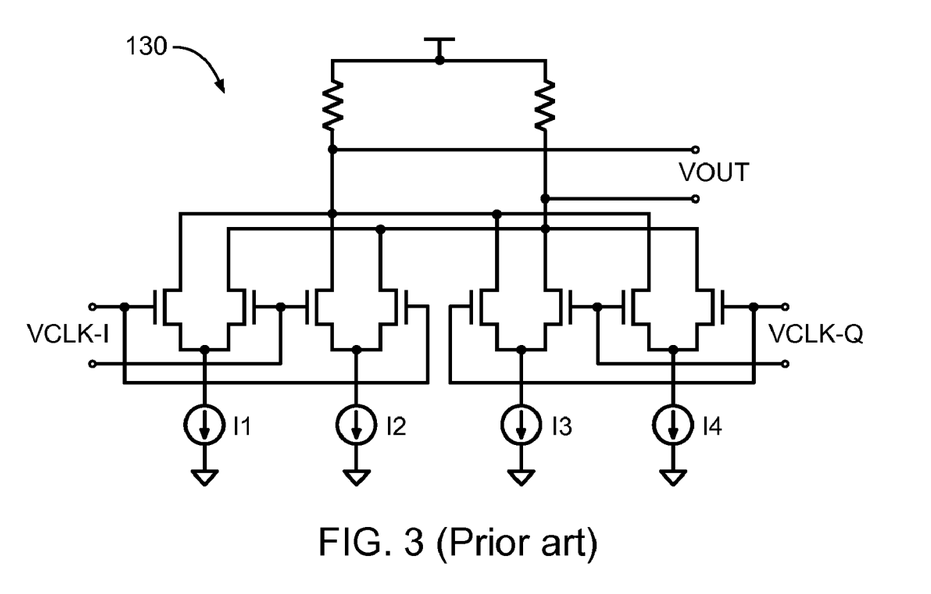
FIG. 3 is a schematic diagram illustrating a conventional implementation of the phase interpolation core of FIG. 1.

FIG. 3 is a schematic diagram illustrating a conventional implementation of the phase interpolation core 130 of FIG. 1. Input signals, VCLK-I and VCLK-Q, are clock signals generated by the receiving chip itself. VCLK-I and VCLK-Q has a predetermined phase relationship. An output signal VOUT has a phase interpolated from the phases of VCLK-I and VCLK-Q. The phase of the interpolated output signal VOUT is determined by the magnitude ratio of the current source I1, I2, I3 and I4, which are in turn controlled by the phase tuning bits, or thermal codes, generated by the phase interpolation controller 120 of FIG. 1. Therefore, a function of the phase interpolation controller 120 is to convert the EARLY or LATE signal to a set of corresponding phase tuning bits which cause the phase interpolation core 130 to shift the phase of the INTERPOLATED CLOCK to be more in-phase with the INCOMING DATA. Conventionally, the phase interpolation controller 120 is formed by an analog filter circuit and a thermal code generator. The analog filter circuit is to filter out jitters and noises inherent in the INCOMING DATA signal. However the analog filter circuit typically includes capacitors, the parameters of which fluctuate with different processes. The bandwidth of the analog filter circuit is typically fixed by design. But a chip may be used in different environments with different noise characteristics. The conventional phase interpolation controller 120 with the analog filter circuit may be designed for one application, but may not be ideal for use in another.

As such, what is desired is a phase interpolation controller that is stable and can be dynamically adjusted for use in various applications.

SUMMARY

This invention discloses a phase interpolation controller for a clock and data recovery circuit, the phase interpolation circuit receiving an indication of a phase relationship between a first and a second signal, the phase interpolation controller comprises a plurality of serially coupled bi-directional shift-registers, wherein when the received indication indicates the first signal is ahead of the second signal in phase, the plurality of serially coupled bi-directional shift-registers shifts in one of the bi-directions, and when the received indication indicates the first signal is behind the second signal in phase, the plurality of serially coupled bi-directional shift-registers shifts in the other of the bi-directions.

In one aspect of the present invention, the phase interpolation controller further comprises an averaging circuit which averages the indication of phase relationship before it is send to the phase interpolation controller.

According to another aspect of the present invention, the number of bi-directional shift-registers engaged in the shift-registering in the phase interpolation controller is dynamically changeable.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses an all digital phase interpolation controller with properties that can be accurately controlled and are not affected by process variations. The noise filtering bandwidth of the all digital phase interpolation controller can be dynamically adjusted, so that it can be used in a wider selection of applications. With the dynamically adjusted filtering bandwidth, the clock and data recovery (CDR) locking time can also be reduced.

Figure 4:
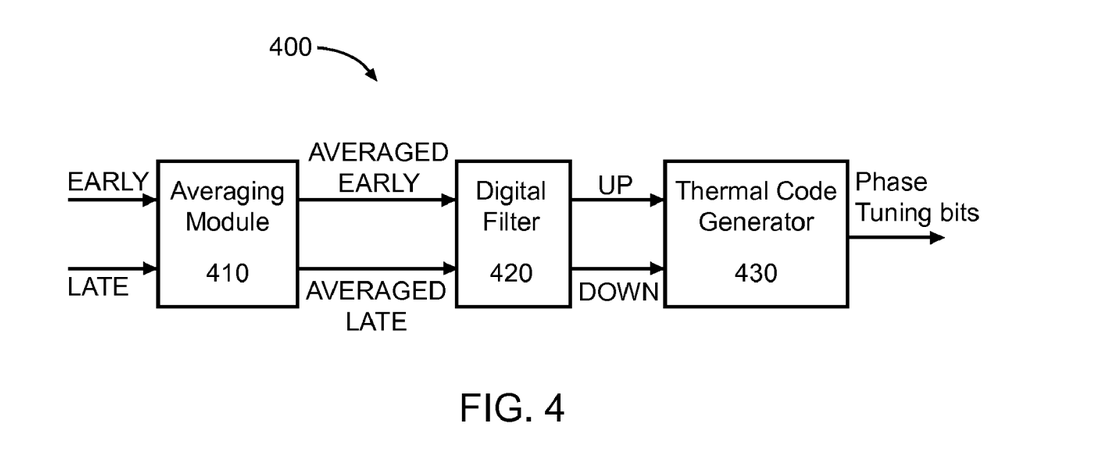
FIG. 4 is block diagram illustrating an all digital phase interpolation controller according to one embodiment of the present invention.

FIG. 4 is block diagram illustrating an all digital phase interpolation controller 400 according to one embodiment of the present invention. The all digital phase interpolation controller 400 comprises a pulse averaging module 410, a digital filter 420 and a thermal code generator 430. The pulse averaging module 410 receives the pulse signals EARLY and LATE and averages them. For instance, in one case, if an EARLY pulse is followed by a LATE pulse, an averaging result is no pulse output from the pulse averaging module 410, as the EARLY pulse and the LATE pulse cancel each other. Such intermittent occurrence of the EARLY and LATE pulses is mostly caused by jittering noise, and the pulse averaging module functions as a filter to filter out such jittering noise. When two consecutive EARLY pulse is received by the pulse averaging module 410, the EARLY signal is considered real and an AVERAGED EARLY pulse is sent out from the pulse averaging module 410 to the digital filter 420. Similarly, when two consecutive LATE pulses are received by the pulse averaging module 410, the LATE signal is considered real and an AVERAGED LATE pulse is sent out from the pulse averaging module 410 to the digital filter 420. Apparently, the pulse averaging module 410 is not limited to two-consecutive-pulse-averaging. It can perform any even-number-consecutive-pulse-averaging, such as four-consecutive-pulse-averaging. The higher the number the less sensitive the phase interpolation controller is to the jittering noise.

Figure 5:
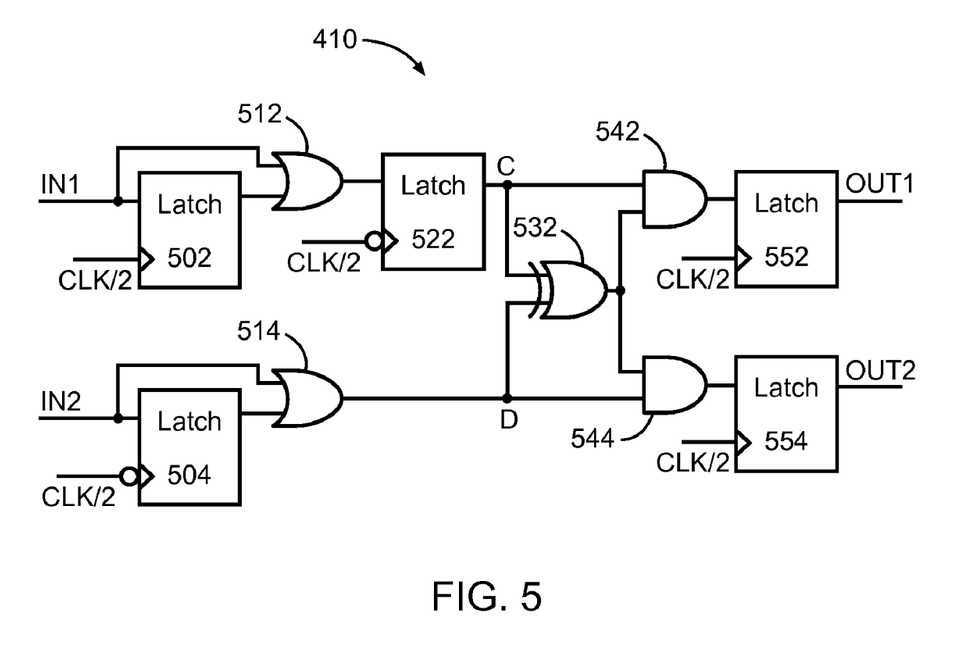
FIG. 5 is a schematic diagram illustrating a circuit implementation of the pulse averaging module of FIG. 4

FIG. 5 is a schematic diagram illustrating a circuit implementation of the pulse averaging module 410 of FIG. 4. The pulse averaging circuit 410 is a simple logic circuit with input terminals IN1 and IN2 coupled to the signals EARLY and LATE, respectively, and output terminals OUT1 and OUT2 provide the AVERAGED EARLY and AVERAGED LATE signals, respectively. Herein the term "coupled" means directly connected or connected through at least one component, but where that added another component supports the circuit function.

Referring again to FIG. 5, the input terminal IN1 passes through two stages of latches 502 and 522, while the input terminal IN2 passes through only one stage of latch 504. Therefore, the signal at a node C has one clock cycle difference than the signal at a node D. The node C and D are coupled to inputs of an XOR gate 532, an output of which controls AND gates 542 and 544. If in a first clock cycle an EARLY pulse is present at the input IN1, and in a second clock cycle, a LATE pulse is present at the input IN2, then the states of the nodes C and D are the same. The XOR gate 532 outputs a "0" which turns off the AND gates 542 and 544. In this case no pulse will be latched by the latches 552 and 554, and there is no AVERAGED EARLY or AVERAGED LATE pulse being generated at the terminals OUT1 and OUT2. On the other hand, if in a first clock cycle an EARLY pulse is present at the input IN1, and in a second clock cycle, also an EARLY pulse is present at the input IN1, then the states of the nodes C and D are different. The XOR gate 532 outputs a "1" which turns on the AND gates 542 and 544. In this case the EARLY pulse will be latched by the latch 552, and there will be an AVERAGED EARLY pulse being generated at the terminal OUT1.

Although the pulse averaging module 410 implemented by a sample register style circuit is illustrated in FIG. 5, a skilled artisan would realize that the pulse averaging function can be implemented by numerous other circuits.

Referring back to FIG. 4, the AVERAGED EARLY and the AVERAGED LATE signal are fed to the digital filter 420 which turns repeated AVERAGED EARLY pulses into an UP pulse and turns repeated AVERAGED LATE pulses into a DOWN pulse. The UP and DOWN pulse is used by the thermal code generator 430 to generate the phase tuning bits. The thermal code generator 430 is conventional and the construction and operation of which are well-known in the art. There is no need for a description of the thermal code generator 430 here. A key to the present invention instead is in the implementation of the digital filter 420.

Figure 6:
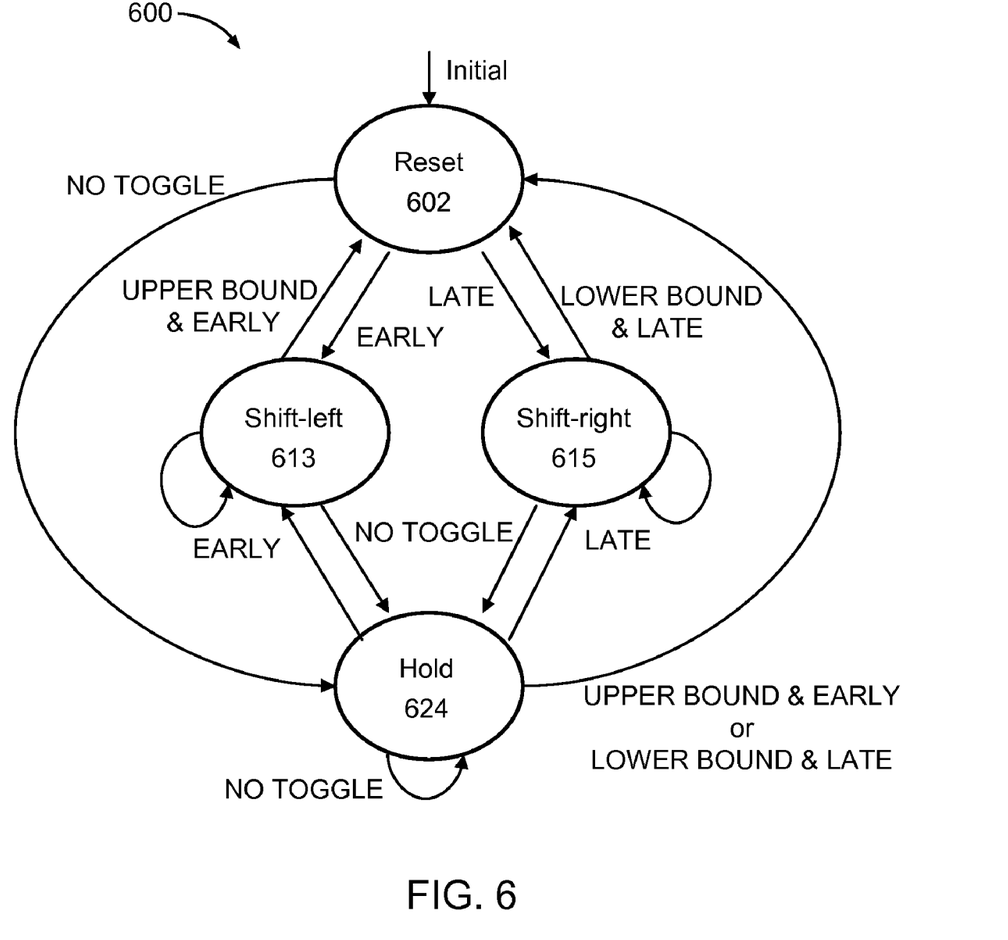
FIG. 6 is a behavior model diagram illustrating a finite state machine 600 implementing the digital filter of FIG. 4.

FIG. 6 is a behavior model diagram illustrating a finite state machine 600 implementing the digital filter 420 of FIG. 4. The finite state machine 600 basically delays acting upon the received EARLY or LATE pulse and let intermittent EARLY and LATE pulses cancel each other, so that noise caused EARLY or LATE pulses can be filtered out. The aforementioned delay and canceling function is achieved by shifting left corresponding to receiving EARLY pulse and shifting right corresponding to receiving a LATE pulse, or vice versa.

Referring again to FIG. 6, the finite state machine 600 has four states, a reset state 602, a shift-left state 613, a shift-right state 615 and a hold state 624. When an EARLY pulse is received, the state transfers from the reset 602 to the shift-left 613. Another EARLY pulse causes another shift-left 613. Without receiving either EARLY or LATE pulse, the finite state machine remains in the hold state 624. When a LATE pulse is received, the state will be transferred to shift-right 615 either from the reset 602, or from the hold 624. When an upper boundary is reached, another EARLY pulse will cause the state to go to the reset 602, and at the same time an UP signal is output to the thermal code generator 430 (not shown). When a lower boundary is reached, another LATE pulse will cause the state to go to the reset 602, and at the same time a down signal is output to the thermal code generator 430 (also not shown).

Figure 7:
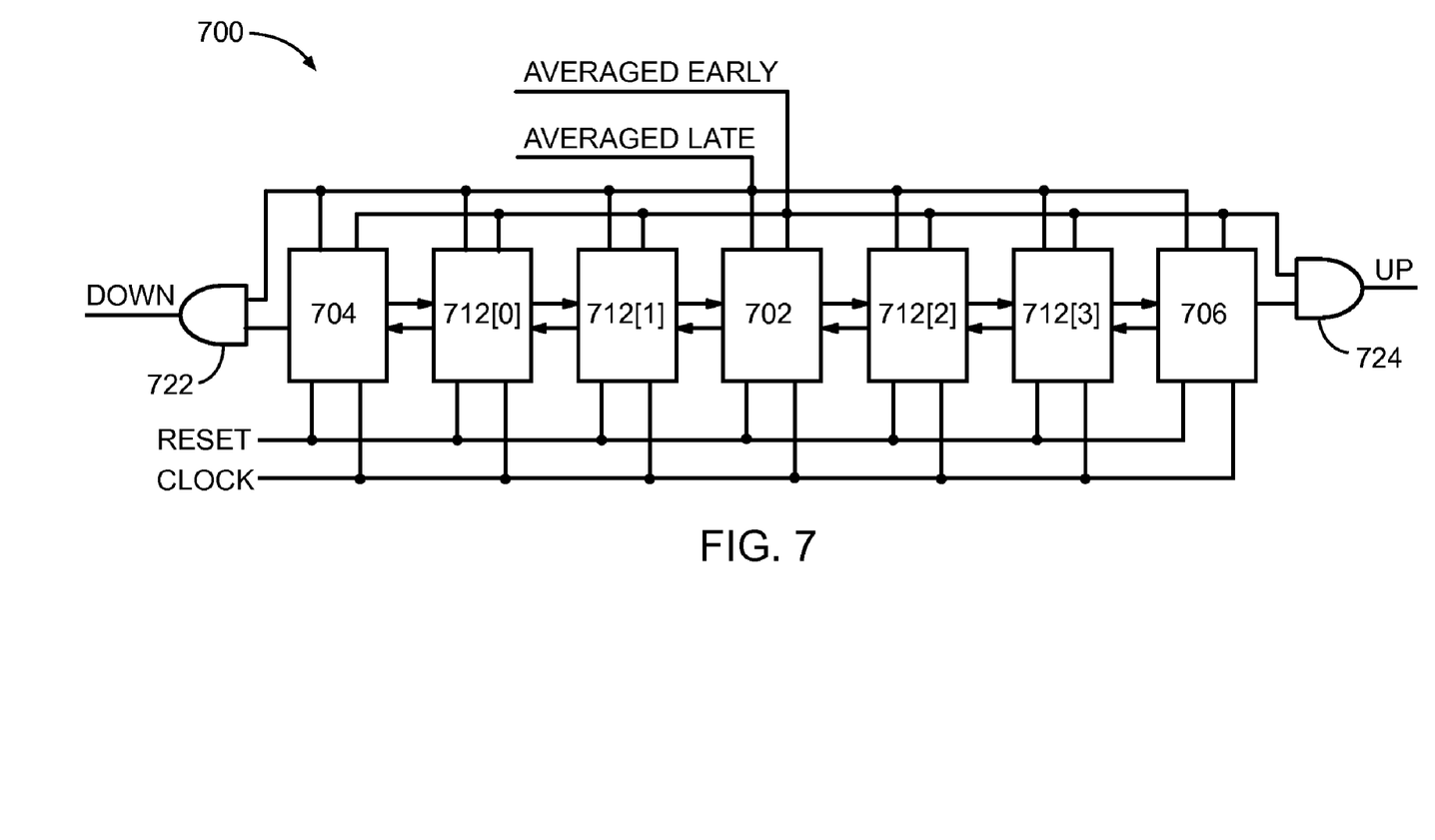
FIG. 7 is schematic diagram illustrating a circuit implementation of the finite state machine of FIG. 6.

FIG. 7 is schematic diagram illustrating a circuit implementation 700 of the finite state machine 600 of FIG. 6. As an example, the circuit 700 has seven serially connected bi-directional shift-register units, 702, 704, 706, and 712[0:3]. These are conventional bi-directional shift-registers. The registers store data performing the hold function in the finite state machine of FIG. 6. The bi-directional shift function implements the shift-left or shift-right state of the finite machine of FIG. 6.

Referring again to FIG. 7, the bi-directional shift-register units 702, 704, and 706, are placed in the center, far left, and far right bit, respectively. The shift-register units 712[0:1] are placed between the center and far left bit. An output of the far left shift-register 704 is coupled to an input of an AND gate 722. An output of the AND gate 722 produces the DOWN signal for the thermal code generator 430 of FIG. 4. The shift-register units 712[2:3] are placed between the center and far right bit. An output of the far right shift-register 704 is coupled to an input of an AND gate 724. An output of the AND gate 724 produces the UP signal for the thermal code generator 430 of FIG. 4. The AVERAGED EARLY and AVERAGED LATE signals are simultaneously fed to each shift-register 702, 704, 706, or 712[0:3] as well the AND gates 722 and 724. The shift-registers, 702, 704, 706, and 712[0:3], shift one bit right when an AVERAGED EARLY pulse is received. The shift-registers, 702, 704, 706, and 712[0:3], shift one bit left when an AVERAGED LATE pulse is received. When a "1" is generated at either the UP or a DOWN signal, a reset signal RESET is activated once, which will reset the shift-register 702 to the "1" and all other shift-registers 704, 706 and 712[0:3] to the "0". Apparently, it takes four consecutive AVERAGED EARLY pulses to shift the "1" from the central shift-register 702 to the UP signal. Similarly, it takes four consecutive AVERAGED LATE pulses to shift the "1" from the central shift-register 702 to the DOWN signal. If the AVERAGED EARLY pulse and the AVERAGED LATE pulse occur intermittently, the right shift and the left shift will cancel each other. Since only consistent early or consistent late is considered true signal, and intermittent early and late are considered noise signals, the circuit 700 can, therefore, filter out the noise signals. The number of the in-between shift-registers placed between the central shift-register 702 and the far-left 704 or far-right 706 shift-register determines the bandwidth of the filter circuit 700. The higher the number of the in-between shift-registers the wider the filtering bandwidth.

Figure 8:
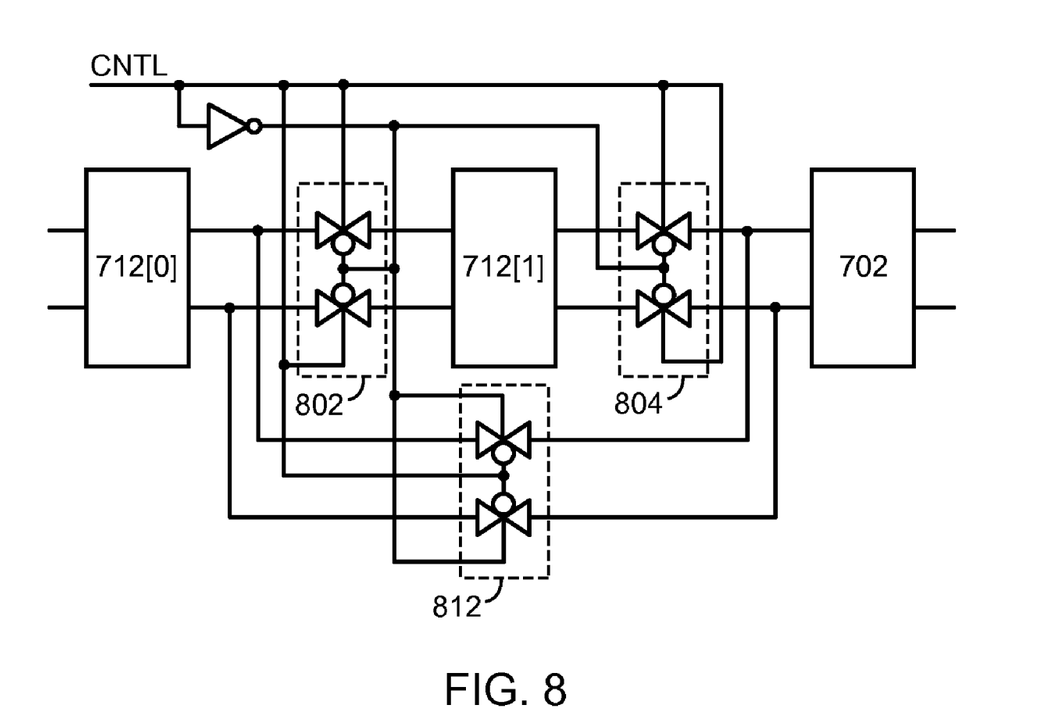
FIG. 8 is a schematic diagram illustrating a circuit for dynamically altering the number of the in-between shift-registers.

FIG. 8 is a schematic diagram illustrating a circuit for dynamically altering the number of the in-between shift-registers. The shift-registers 702, 712[1] and 712[0] are connected, instead of directly as shown in FIG. 7, through transmission gate pairs 802, 804, and 812. These transmission gate pairs are controlled by a control signal CNTL. When the control signal CNTL is in the "1" state, the transmission gate pairs 802 and 804 are turned on while the transmission gate pair 812 is turned off. In this case, the shift-register 702 is connected to 712[1], and the shift-register 712[1] is connected to 712[0]. When the control signal CNTL is in the "0" state, the transmission gate pairs 802 and 804 are turned off while the transmission gate pair 812 is turned on. In this case, the shift-register 702 is connected to 712[0]. The shift-register 712[1] is by-passed.

Although only one shift-register 712[1] is dynamically engaged or by-passed in FIG. 8, a skilled in the art, would have difficulty to apply such transmission gate scheme to any number of shift-registers. Besides, the implementation of the dynamically altering the number of the in-between shift-registers is not limited is the aforedescribed transmission gate scheme, many other designs, such as those using multiplexers, can also achieve the same results.

By dynamically altering the number of the in-between shift-registers, the digital filtering circuit 420 of FIG. 4 can dynamically adjust filtering bandwidth. One benefit is to shorten the locking time between an incoming data signal and an internally generated clock signal by making the digital filter having a wide filtering bandwidth at the beginning and then reducing the bandwidth as the incoming data signal and the clock signal converge.

Referring back to FIG. 4, a skilled in the art would realize that the averaging module 410 can also be implemented by the shift-register circuit 700 of FIG. 7. But the shift-register circuit 700 is much more complicated. Apparently both the averaging module 410 and the digital filter 420 perform filtering functions. The averaging module 410 on a first stage filters out continuous toggling in the EARLY and LATE signals. The digital filter 420 can dynamically control its filtering bandwidth for broader application as well as for shortening CDR's incoming data and clock locking time. Both the averaging module 410 and the digital filter 420 is entirely constructed by digital circuit, therefore, the parameters of the phase interpolation controller 400 can be accurately controlled and not affected by process variations.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A phase interpolation controller for a clock and data recovery circuit, the phase interpolation controller receiving an indication of a phase relationship between a first signal and a second signal, the indication including an early signal and a late signal, the phase interpolation controller comprising:
    a pulse averaging circuit having a first input terminal for receiving the early signal and a second input terminal for receiving the late signal, wherein the pulse averaging circuit is configured to provide an averaged early signal at its first output terminal and an averaged late signal at its second output terminal; and
    a plurality of serially coupled bi-directional shift-registers, each of the shift-registers being configured to receive the averaged early and late signals simultaneously, wherein the plurality of serially coupled bi-directional shift-registers shift in one of the bi-directions when the averaged early signal is received and shift in the other of the bi-directions when the averaged late signal is received.

2. The phase interpolation controller of claim 1, wherein the indication comprises a third and a fourth signal, the third signal when being activated indicating the first signal being ahead of the second signal in phase, the fourth signal when being activated indicating the first signal being behind the second signal in phase.

3. The phase interpolation controller of claim 1, wherein the pulse averaging circuit comprises two stages of latches coupled to the first input terminal and one stage of latch coupled to the second input terminal.

4. The phase interpolation controller of claim 3, wherein the averaging circuit is configured to provide a first averaged indication when consecutively receiving two identical indications of the phase relationship and to provide a second average indication when consecutively receiving two different indications of the phase relationship.

5. The phase interpolation controller of claim 1 further comprising a thermal code generator coupled to one end of the plurality of serially coupled bi-directional shift-registers a count-up signal, and coupled to the other end of the plurality of serially coupled bi-directional shift-registers such that it receives a count-down signal.

6. The phase interpolation controller of claim 1, wherein the number of the plurality of serially coupled bi-directional shift-registers engaged in the shift-registering is dynamically changeable.

7. A phase interpolation controller for a clock and data recovery circuit, the phase interpolation controller receiving an indication of a phase relationship between a first signal and a second signal, the indication including an early signal and a late signal, the phase interpolation controller comprising:
   a pulse averaging circuit having a first input terminal for receiving the early signal and a second input terminal for receiving the late signal, wherein the pulse averaging circuit is configured to provide an averaged early signal at its first output terminal and an averaged late signal at its second output terminal; and
   an odd number of serially coupled bi-directional shift-registers, each of the shift-registers being configured to receive the averaged early and late signals simultaneously, wherein the odd number of serially coupled bi-directional shift-registers shift in one of the bi-directions when the averaged early signal is received and shift in the other of the bi-directions when the averaged late signal is received.

8. The phase interpolation controller of claim 7, wherein the pulse averaging circuit comprises two stages of latches coupled to the first input terminal and one stage of latch coupled to the second input terminal.

9. The phase interpolation controller of claim 8, wherein the averaging circuit is configured to provide a first averaged indication when consecutively receiving two identical indications of the phase relationship and to provide a second average indication when consecutively receiving two different indications of the phase relationship.

10. The phase interpolation controller of claim 7 further comprising a thermal code generator coupled to one end of the odd number of serially coupled bi-directional shift-registers such that it receives a count-up signal, and coupled to the other end of the odd number of serially coupled bi-directional shift-registers such that it receives a count-down signal.

11. The phase interpolation controller of claim 7, wherein the number of the odd number of serially coupled bi-directional shift-registers engaged in the shift-registering is dynamically changeable.

* * * * *